United States Patent
Takabayashi

(10) Patent No.: US 8,179,518 B2
(45) Date of Patent: May 15, 2012

(54) EXPOSURE APPARATUS TO CORRECT POSITION BETWEEN RETICLE AND SUBSTRATE ACCORDING TO PROPAGATION TIME AND SHIFTING RATE

(75) Inventor: Yukio Takabayashi, Saitama (JP)

(73) Assignee: Canon Kabushiki Kaisha, Tokyo (JP)

( * ) Notice: Subject to any disclaimer, the term of this patent is extended or adjusted under 35 U.S.C. 154(b) by 685 days.

(21) Appl. No.: 12/046,709

(22) Filed: Mar. 12, 2008

(65) Prior Publication Data

US 2008/0284997 A1    Nov. 20, 2008

(30) Foreign Application Priority Data

Mar. 19, 2007    (JP) .................................. 2007-070930

(51) Int. Cl.
*G03B 27/68* (2006.01)
(52) U.S. Cl. ........................................................ 355/52
(58) Field of Classification Search .................... 355/52, 355/53

See application file for complete search history.

(56) References Cited

U.S. PATENT DOCUMENTS 6,934,004 B2    8/2005  Yoshimura
2006/0248497 A1*  11/2006  Huang et al. .................... 716/21

FOREIGN PATENT DOCUMENTS

JP    2003-272989 A    9/2003
JP    2003-273007 A    9/2003

* cited by examiner

*Primary Examiner* — Peter B Kim
*Assistant Examiner* — Chia-how Michael Liu
(74) *Attorney, Agent, or Firm* — Canon USA Inc IP Division

(57) ABSTRACT

A scanning exposure apparatus projects a pattern of an original onto a substrate via a projection optical system and shifts the original and the substrate in synchronization with each other with respect to an optical axis of the projection optical system so as to transfer the pattern of the original to the substrate by exposure. The scanning exposure apparatus includes a unit configured to correct a relative position between the original and the substrate by a correction amount according to a shifting rate at which the original and the substrate are shifted in synchronization with each other.

10 Claims, 4 Drawing Sheets

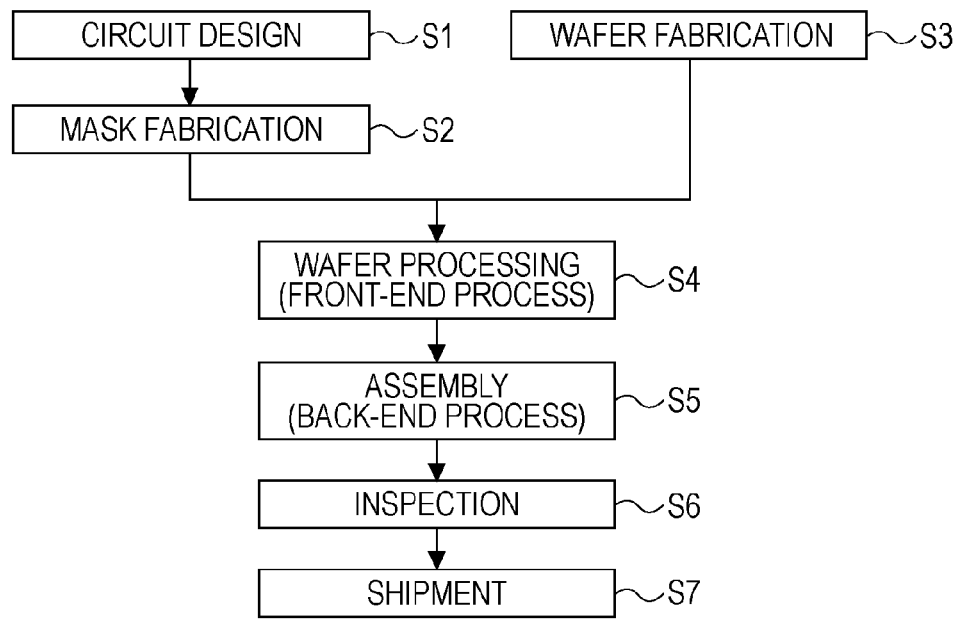
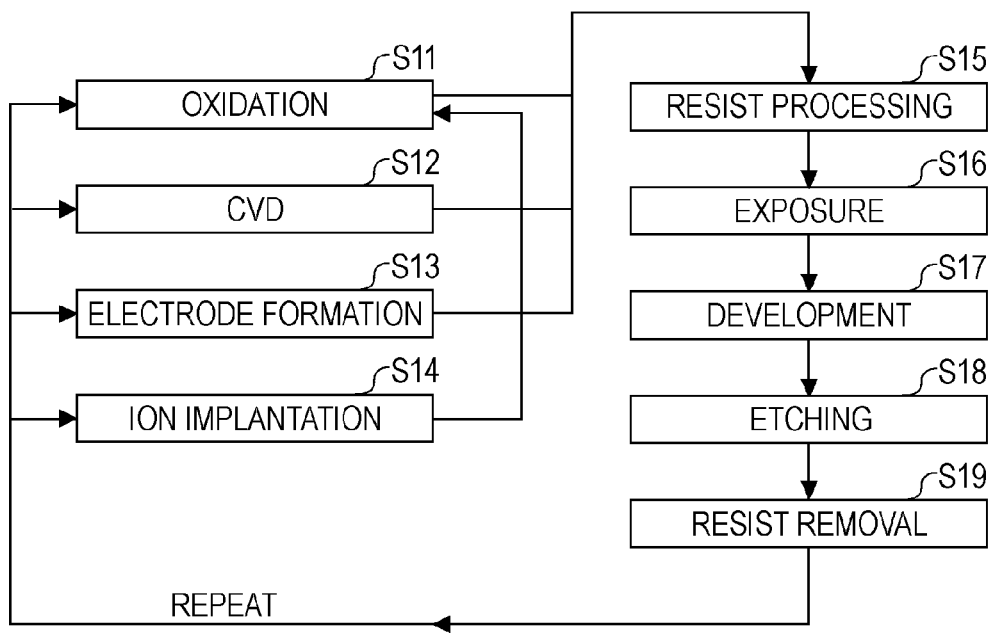

EXPOSURE APPARATUS TO CORRECT POSITION BETWEEN RETICLE AND SUBSTRATE ACCORDING TO PROPAGATION TIME AND SHIFTING RATE

BACKGROUND OF THE INVENTION

1. Field of the Invention

The present invention relates to an exposure apparatus that transfers a pattern of an original to a substrate by exposure, and particularly, to a scanning exposure apparatus that performs exposure while scanning an original and a substrate. An exposure apparatus of this type is used for manufacturing semiconductor devices, liquid-crystal devices, MEMS elements, image pickup devices, and magnetic heads.

2. Description of the Related Art

The following is a description of related art concerning the manufacture of semiconductor devices, which is considered to be the field where device miniaturization is most advanced.

In a manufacturing process of semiconductor devices, a front-end process and a back-end process to be described below are repeated to form transistors. A front-end process involves applying a resist layer over various thin films formed on a silicon substrate. A back-end process includes a lithography step for transferring a circuit pattern onto the resist layer by exposure, a resist development step, and an etching step. Particularly, the exposure apparatus used in the lithography step significantly contributes to the miniaturization of transistors for enhancing the degree of integration. Up to this day, semiconductor devices have been becoming more and more miniaturized without showing any sign of stopping, and the degree of integration has been doubling every two years in accordance with the so-called Moore's Law. Until we face unavoidable technical issues, further miniaturization is expected to continue.

To achieve miniaturization in the lithography step is substantially equivalent to increasing the resolution of a lens in the exposure apparatus. According to Rayleigh's formula, resolution can be expressed as $k1 \cdot \lambda / NA$. In this case, $\lambda$ represents a wavelength of a light source, NA represents a numerical aperture of a projection lens, and $k1$ represents a coefficient determined as a result of processing. In order to utilize the NA to a maximum extent, exposure apparatuses have been shifted from a square field angle full plate exposure method (i.e. stepper) to a scanning exposure method (i.e. scanner). A scanning exposure method applies a strip-shaped exposure area that utilizes the lens to its maximum fabricatable diameter so as to increase the width of the field angle. In a scanning exposure method, an exposure process is performed while scanning is performed in the vertical direction. In addition to the advantage of achieving a larger field angle by utilizing the maximum diameter of the lens with the strip-shaped exposure area, a scanning exposure method is advantageous in view of achieving miniaturization, such as having the capability to continuously maintain a focused state during a scanning exposure process and to obtain a large field angle in the scanning direction.

On the other hand, in addition to the improvement of resolution, another significant improvement in exposure apparatuses is productivity. In particular, an effective way to improve the productivity in a scanning exposure apparatus is to raise the maximum shifting rate of a wafer-holding stage in order to increase the speed of the scanning exposure process. With respect to the shifting rate of the wafer stage, a reticle stage that holds a reticle serving as an original is shifted at a rate that is in inverse ratio to the projection magnification of the lens. Under the present circumstances, it is most common that the projection magnification is ¼×, the shifting rate of the wafer stage is substantially 0.5 m/s, and the shifting rate of the reticle stage is 2 m/s. For the improvement of productivity, a further increase in the scanning rate is expected.

In a scanning exposure apparatus, exposure light transmitted through the reticle must be accurately projected onto a chip of the wafer through the projection lens. The reticle stage and the wafer stage have individual position measuring systems that use laser interferometers, and are driven in accordance with predetermined scan profiles. During a scanning exposure process, vibration occurring from the shifting of the stages, load deformation in stage guiding faces, and uneven driving forces, for example, can cause positional errors. Errors that have occurred on the respective stages are evaluated with deviation indicators with respect to target positions on the stages. Furthermore, an indicator called synchronization accuracy that indicates the difference between the deviation of the reticle and the deviation of the wafer is used in order to evaluate an alignment error in the relative position of the stages that should originally be aligned in synchronization with each other.

An error in synchronization accuracy is a kind of displacement unique to scanning exposure apparatuses. The low frequency component of the spatial frequency in the error can cause scan distortion (i.e. distortion within the field angle), and the high frequency component can cause contrast deterioration (i.e. deterioration in the image quality). Moreover, the direct-current component becomes an amount of displacement in an entire shot and directly affects the alignment accuracy. Japanese Patent Laid-Open No. 2003-273007 proposes a control method in which distortion data generated in each shot under a predetermined scanning rate is set by a measuring unit for every shot, and a correction drive value is calculated on the basis of the distortion data, so that correction is performed on a shot-by-shot basis. This correction is advantageous in that displacement and distortion occurring in a scanning exposure process can be corrected, and is particularly effective for reducing distortion errors that are highly repeatable.

However, the correction method disclosed in Japanese Patent Laid-Open No. 2003-273007 has several problems. First of all, in order to calculate a correction value to perform feedback on the correction using the exposure result, it is necessary to actually print a pattern on the wafer and measure the printed pattern with the measuring unit.

Furthermore, because the correction value is set on the basis of the exposure result, an accurate correction amount can only be determined within a measurable exposure range, that is, the area corresponding to the shot size. Performing a scan alignment on the reticle stage and the wafer stage based on TTL method using an alignment mark located outside the exposure range is problematic in that the correction is not possible since the alignment mark is outside the correction range. Even though Japanese Patent Laid-Open No. 2003-273007 proposes a unit that extrapolates a correction value for outside the exposure range using an approximate function, such a unit is intended for improving the follow-up of the correction value in the exposure range and does not have a sufficient function for actively and accurately performing positional correction for outside the exposure range.

According to the knowledge of the present inventor, there has been arisen a new problem, which was not an issue in the past. Specifically, the scanning rate of scanning exposure apparatuses has been increasing generation by generation for the purpose of improving productivity as mentioned above. In addition, the demand for higher overlay accuracy of patterns has been becoming higher year after year. Due to these two technical trends, the effect of a propagation delay of light is becoming a problem, which was not an issue in the past. While exposure light passes through the reticle and reaches the wafer through a lens, the wafer stage is shifted by an amount equivalent to the time that takes for the exposure light to travel from the reticle to the wafer. Therefore, even if the reticle stage and the wafer stage are in an idealistic control state where control deviations of the stages are both zero, a displacement dependent on the shifting rates still occurs. This displacement becomes a definitive error that is uniquely determined by the light velocity and the stage shifting rates.

In the related art, displacement errors occurring due to various factors such as a deformation error, vibration, and uneven force included in the exposure result are collectively measured, calculated, and corrected. If there is a large error component in the components of the correction value, a small error component will unfavorably be hidden. If a large error component can be determined definitively, it is desirable that the large error component be removed as a definitive error so that a small error component can be subsequently corrected with high precision. Since a propagation delay of light taken into consideration in the present invention corresponds to a definitive error, a propagation delay of light should be removed in advance separately from other error factors in order to improve the accuracy of the correction.

Here, an amount of delay in the light velocity, which is a definitive displacement error, will be estimated.

In a current scanning exposure apparatus, a propagation time tl of light between the object and the image can be expressed as follows:

$$tl = L \cdot (na(1-\gamma) + \gamma ng)/c \quad \text{Expression 1}$$

where L indicates an object-image distance between the reticle serving as an original and the wafer serving as a substrate subject to exposure, which is approximately 1 m, γ indicates a glass containing rate of a reduction projection optical lens disposed between the reticle and the wafer, which is about 90% with respect to the center of the optical axis, c indicates a light velocity that is $2.99 \times 10^8$ m/s, na indicates a refractive index of air that is 1.00, and ng indicates a refractive index of glass that is 1.47. Consequently, $tl = 4.7 \times 10^{-9}$ sec.

An amount of displacement d of the wafer stage is expressed as follows:

$$d(v) = v \cdot tl \quad \text{Expression 2}$$

where v indicates the scanning rate of the exposure apparatus, which is 1 m/s at the wafer stage. Consequently, d=4.7 nm.

Since the scanning direction is inverted between adjacent shots, the amount of displacement in Expression 2 doubles between adjacent shots so as to become 9.4 nm.

In recent years where an alignment accuracy of 10 nm or less is required in exposure apparatuses, an amount of displacement caused by a delay of light is not negligible. The necessity to increase the scanning rate for further throughput improvement will lead to a larger amount of displacement.

FIG. 4 is a conceptual diagram of a pattern that has been transferred onto a wafer W1 by exposure. To improve the productivity, a scanning exposure apparatus reciprocally scans the reticle stage serving as an original so that the exposure process can be successively performed at a high operating rate. Thus, the exposed shots form an array in which shots SA and shots SB respectively transferred and exposed as a result of positive (+) direction scanning and negative (−) direction scanning of the reticle stage are alternately arranged. In FIG. 4, the arrows represent the scanning directions of exposure light with respect to the corresponding shots (the shifting directions of the stage being opposite to the scanning directions). If there is no propagation delay of light and ideal synchronization control of the reticle stage serving as an original and the wafer stage is achieved, there should be no displacement among adjacent shots. However, in a case where an exposure process is performed at a scanning rate that is affected by the aforementioned propagation delay of light, the horizontally adjacent shots are displaced from one another in the scanning direction, resulting in a defective arrangement as shown in FIG. 4.

In an exposure apparatus of the related art, the propagation delay of light is not taken into account for the calculation of the synchronization accuracy. For this reason, even if an error in the synchronization accuracy is ideally reduced to zero, a displacement still appears in the exposure result. In other words, in the calculation method of the related art, the synchronization accuracy and the exposure result vary from each other.

SUMMARY OF THE INVENTION

The present invention provides an exposure apparatus that corrects a displacement caused by a propagation delay of light occurring during an exposure process so as to improve the overlay accuracy of patterns.

An exposure apparatus according to a first aspect of the present invention projects a pattern of an original onto a substrate via a projection optical system and shifts the original and the substrate in synchronization with each other with respect to an optical axis of the projection optical system so as to transfer the pattern of the original to the substrate by exposure. The scanning exposure apparatus includes a unit configured to correct a relative position between the original and the substrate by a correction amount according to a shifting rate at which the original and the substrate are shifted in synchronization with each other.

An exposure apparatus according to a second aspect of the present invention projects a pattern of an original onto a substrate via a projection optical system and shifts the original and the substrate in synchronization with each other with respect to an optical axis of the projection optical system so as to transfer the pattern of the original to the substrate by exposure. The exposure apparatus includes an alignment optical system configured to perform alignment measurement between the original and the substrate, and a unit configured to correct a measured value obtained from the alignment measurement by an amount according to a shifting rate of the original or the substrate, the measured value being corrected when the alignment measurement between the original and the substrate is being performed by the alignment optical system via the projection optical system while the original and the substrate are shifted in synchronization with each other.

An exposure method according to a third aspect of the present invention is for projecting a pattern of an original onto a substrate via a projection optical system and shifting the original and the substrate in synchronization with each other with respect to an optical axis of the projection optical system so as to transfer the pattern of the original to the substrate by exposure. The method includes a step for correcting a relative position between the original and the substrate by a correction amount according to a shifting rate at which the original and the substrate are shifted in synchronization with each other.

An exposure method according to a fourth aspect of the present invention is for projecting a pattern of an original onto a substrate via a projection optical system and shifting the original and the substrate in synchronization with each other with respect to an optical axis of the projection optical system so as to transfer the pattern of the original to the substrate by exposure. The method includes a step for correcting a measured value obtained from alignment measurement between the original and the substrate performed by an alignment optical system, the measured value being corrected by an amount according to a shifting rate of the original or the substrate, the measured value being corrected when the alignment measurement between the original and the substrate is being performed by the alignment optical system via the projection optical system while the original and the substrate are shifted in synchronization with each other.

Further features and aspects of the present invention will become apparent from the following description of exemplary embodiments with reference to the attached drawings.

BRIEF DESCRIPTION OF THE DRAWINGS

FIG. 5 is a flow chart illustrating a device manufacturing process.

FIG. 6 illustrates a wafer processing step.

DESCRIPTION OF THE EMBODIMENTS

Figure 1:
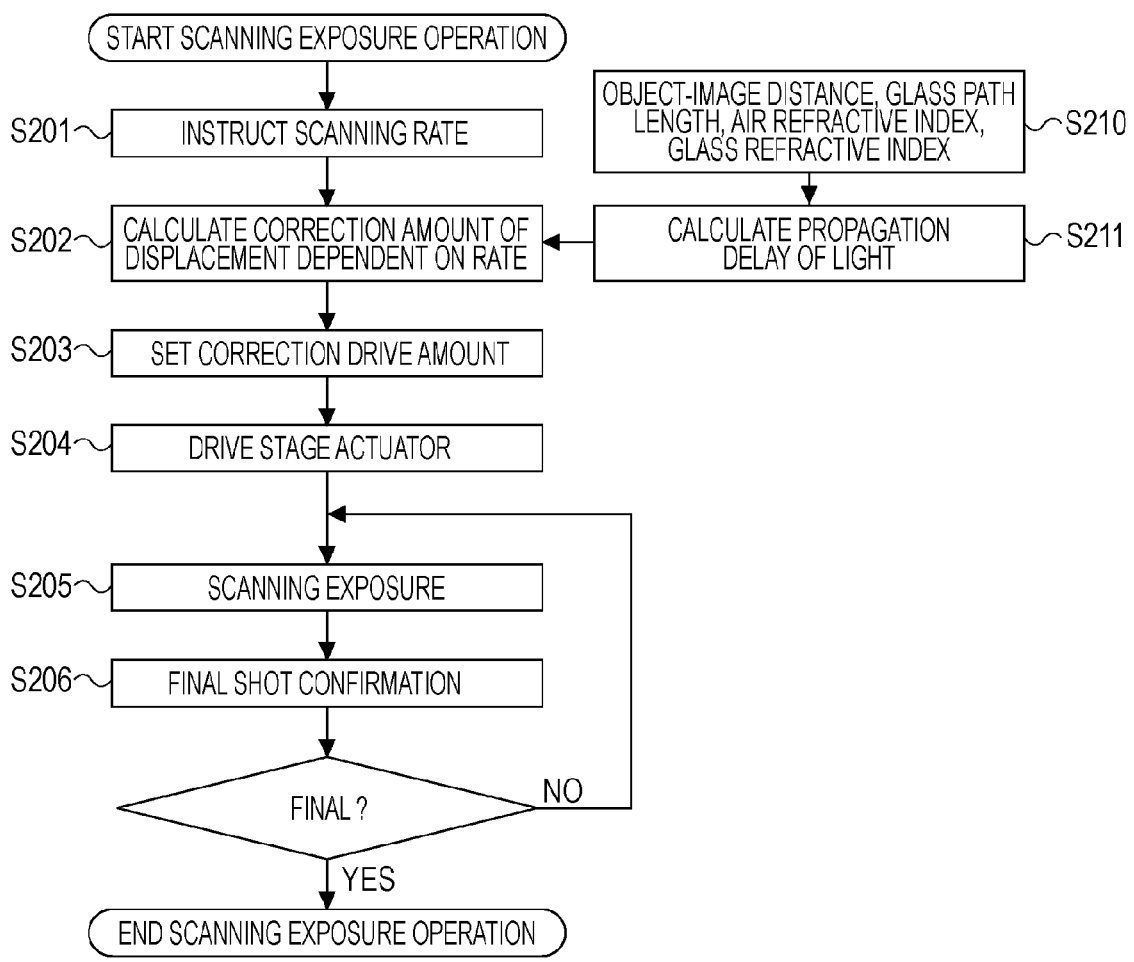
FIG. 1 is a flow chart according to a first exemplary embodiment of the present invention.

An exposure apparatus according to the present invention is directed to a scanning exposure apparatus that projects a pattern of an original onto a substrate via a projection optical system and shifts the original and the substrate in synchronization with each other with respect to an optical axis of the projection optical system so as to transfer the pattern of the original to the substrate by exposure. The scanning exposure apparatus includes a unit configured to correct a relative position between the original and the substrate by a correction amount according to a shifting rate at which the original and the substrate are shifted in synchronization with each other. Alternatively, the exposure apparatus includes an alignment optical system configured to perform alignment measurement between the original and the substrate. In that case, the exposure apparatus performs alignment measurement between the original and the substrate via the projection optical system while shifting the original and the substrate in synchronization with each other, and is used in the following manner. Specifically, the exposure apparatus corrects a measured value obtained from the alignment measurement by an amount according to the shifting rate.

Here, the correction amount for the relative position is proportional to a propagation delay of light between a pattern surface of the original and an exposed surface of the substrate. In detail, the correction amount for the relative position is determined by, for example, multiplying the propagation delay of the light by the shifting rate of the substrate.

According to an exemplary embodiment of the present invention, the exposure apparatus has a function for calculating a propagation delay of exposure light, a function for calculating a target-control-value correction amount on the basis of the propagation delay of exposure light and the scanning rate, and a controlling function for controlling a stage in accordance with a new target control value corrected on the basis of the target-control-value correction amount. The exposure apparatus also has a function for calculating synchronization accuracy given the target-control-value correction and a function for correcting a measured value obtained from alignment measurement during a scanning process if the measured value needs correction due to the propagation delay of light.

The relative position is corrected with respect to a target position (target control value) on the original or the substrate. The target-control-value correction amount (i.e. the correction amount of the relative position) is calculated in real time with the driving of a stage (shifting of the original or the substrate). Specifically, the relative position is corrected in real time in accordance with the shifting rate at each instant in the course of a scanning exposure process. Alternatively, a correction value may be reflected on a preliminarily set driving (shift) profile. In other words, the relative position is corrected with respect to a preliminarily determined first shift profile for a scanning exposure process, and a second shift profile is generated as a result of the correction. For an actual exposure process, the scanning exposure is performed in accordance with the second shift profile. Target control correction is implemented on one of or each of a reticle stage and a wafer stage. This correction is effective not only during an actual exposure process, but also when scan alignment (i.e. measurement for positioning) is performed with respect to the reticle side and the wafer side.

Various exemplary embodiments of the present invention will now herein be described with reference to the drawings.

First Exemplary Embodiment

Example Structure of Exposure Apparatus

Figure 3:
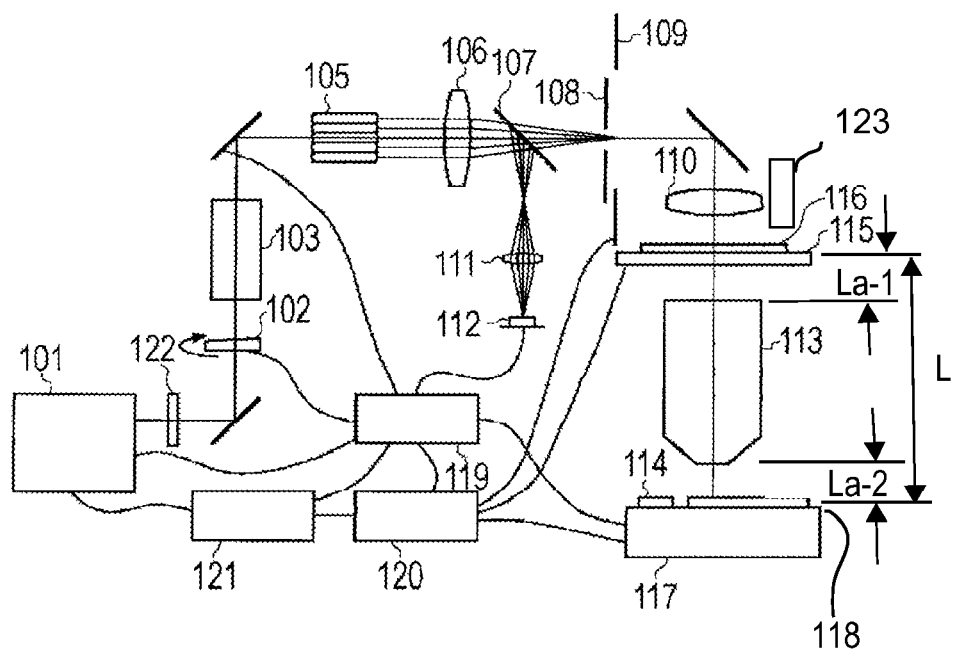
FIG. 3 schematically illustrates a scanning exposure apparatus according to an exemplary embodiment of the present invention.
Figure 4:
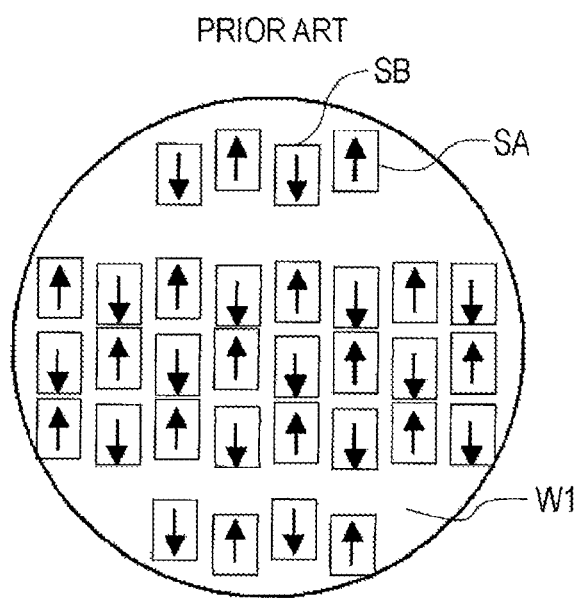
FIG. 4 is a conceptual diagram of a wafer in which displacement occurring as a result of a delay of exposure light is shown.

FIG. 3 schematically illustrates a scanning exposure apparatus according to an exemplary embodiment of the present invention. The exposure apparatus includes a light source 101 such as an excimer laser or an i-line lamp, an optical member 122 having a plurality of light-attenuating rates that cause attenuation of light from the light source 101, an optical unit 102 for eliminating uneven illumination by oscillating the angle of coherent light such as a laser beam, a beam shaping optical unit 103 for shaping the light beam from the light source 101 and converting the light beam into an incoherent light beam, an optical integrator 105 serving as a secondary light source, and a condenser lens 106 that illuminates a surface of a masking blade 109 with a light beam from the optical integrator 105. A typical example of the optical member 122 is an ND filter with different transmittance.

The exposure apparatus also includes a half mirror 107 used for splitting the light beam from the optical integrator 105 into beam components. A portion of the split beam components travels through a condenser lens 111 so as to enter a light-amount sensor 112, and is used for detecting an amount of exposure on a wafer (substrate) 118. The masking blade (light-blocking plate) 109 is constituted by four light-blocking members, i.e. upper, lower, left, and right light-blocking members, which move independently of one another. With respect to an imaging lens 110, the masking blade 109 is in an optically conjugate relationship with a reticle (original) 116. An exposure slit 108 is formed by two sets of light-blocking members that partly block light beams in a direction perpendicular to an optical axis within the plane of the drawing. The slit 108 is located at a position that is shifted from the surface of the masking blade 109 in the optical axis direction. For this reason, the light intensity distribution by the slit 108 is trapezoidal with respect to the optical axis at the center.

The imaging lens 110 focuses the light partly blocked by masking onto the reticle 116 so as to form an image thereon. A projection lens (projection optical system) 113 projects the image formed on the reticle 116 onto the wafer 118. The reticle 116 is set and positioned on a reticle stage 115, and the wafer 118 is placed on a wafer stage 117. These stages are driven in a floating fashion using, for example, air pads, such that the stages can be driven freely two-dimensionally.

The amount of exposure on the wafer surface is detected and controlled by the light-amount sensor (photo detector) 112. The wafer stage 117 has an illuminometer 114 mounted thereon. By preliminarily checking the relationship in detection values between the illuminometer 114 and the light-amount sensor (photo detector) 112 prior to an exposure process, the wafer surface can be given a desired amount of exposure.

An exposure-apparatus I/F (interface) 121 is provided for receiving various conditions for prescribing the operational conditions of the exposure apparatus through an input device (such as a keyboard or a mouse). At the same time, the exposure-apparatus I/F 121 is used for managing, for example, wafer printing conditions and printing layouts. Specifically, an operator can use the exposure apparatus by selecting a desired condition from these managed conditions. In this case, the operator can select and input the desired condition for using the exposure apparatus through the exposure-apparatus I/F 121. The exposure-apparatus I/F 121 is connected to, for example, a backbone network in which the exposure apparatus is situated or to a local area network 120. There are cases where the operational conditions of the exposure apparatus are downloaded from the network.

A main control unit 119 executes various correcting functions of the exposure apparatus and drives and controls each of the units in accordance with an instruction from the operator through the exposure-apparatus I/F 121 or an instruction downloaded from the backbone network.

Example Displacement Correction

An example procedure for correcting displacement or distortion (i.e. distorted shot shape) in a scanning exposure operation will be described in detail below. Referring to a flow chart shown in FIG. 1, displacement or distortion correction in a scanning exposure operation is a preliminary process performed for generating data to be used for driving, for example, an actuator in step S204. Specifically, a displacement is preliminarily quantified in order to generate a correction value (in steps S201 to S203 in FIG. 1), and desired drive profile data is corrected on the basis of the correction value in order to obtain control data.

Here, a calculation with regard to a propagation delay of exposure light can be implemented on the basis of design values of the exposure apparatus. The minimally required design values are an object-image distance L between the reticle and the wafer, an air gap, which is the sum of air gaps La-1 and La-2, of the projection lens on the optical axis, an air refractive index na, and a glass refractive index ng (S210). If the interior of the projection optical system is in a specific gas environment, a refractive index that corresponds to that environment may be used. If a reflective optical system is used, such as in an EUV exposure apparatus, a delay time in an object-image distance can be similarly calculated. From these physical values, the time that takes for the light to pass through the pattern surface of the reticle and reach the wafer can be directly determined (S211). Since this determined value is a constant, it is not necessary to calculate the value each time, and the value may be set preliminarily.

By multiplying this delay time value by a scanning rate instructed in step S201, an amount of displacement to be corrected can be calculated (S202). Then, a correction drive amount is set based on the calculated correction amount (S203).

From step S204 onward, the stages are driven so as to switch to an exposure process (S205). After a final shot is confirmed (S206), the exposure operation is completed.

In the operation shown in FIG. 1, the correction value setting process may be implemented with respect to a target value of one of the reticle stage and the wafer stage or may be implemented distributively with respect to the target values of both stages. Although not shown in FIG. 1, a typical distortion correction process may be additionally included between steps S201 to S204.

Second Exemplary Embodiment

Although a correction value is calculated in the first half of the scanning exposure operation in the first embodiment, a real-time calculation may alternatively be incorporated. Specifically, in a real-time calculation, a value obtained by multiplying the scanning rate by the propagation delay of light is directly subtracted from a position command signal for the wafer stage.

Third Exemplary Embodiment

Although a correction value is calculated in the first half of the scanning exposure operation in the first embodiment, a similar effect can be achieved alternatively by calculating a correction value on the basis of the scanning direction and the scanning rate immediately before each shot.

Fourth Exemplary Embodiment

Figure 2:
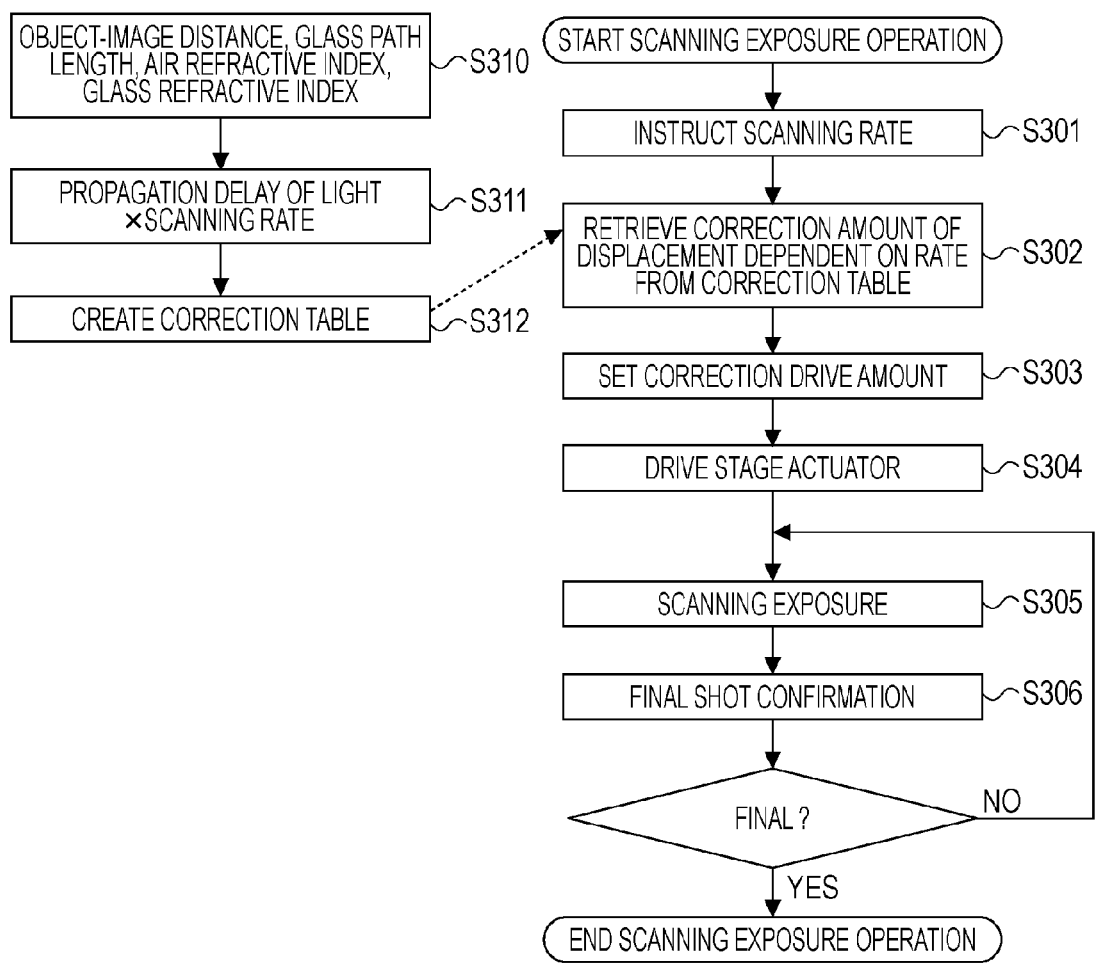
FIG. 2 is a flow chart according to a fourth exemplary embodiment of the present invention.

Referring to FIG. 2, instead of performing the correction-value calculation at the start of the exposure operation as in the first embodiment, a correction table having a scanning rate as a parameter may be preliminarily set in step S312. In this case, the correction may be performed by accessing the table for every exposure condition (scanning-rate condition). Furthermore, values used for correcting other error factors may be preliminarily reflected on the correction table. Thus, steps S301 through S306 are the same or similar to steps S201 through S206 from FIG. 2. Moreover, step S310 is the same or similar to step S210. In step S311, the propagation delay of light is calculated via scanning rate and in step S312 a correction table is created.

Fifth Exemplary Embodiment

In a fifth embodiment, the input device serving as an interface for the exposure apparatus has an area used for inputting apparatus information related to a propagation delay of exposure light. Various apparatus configuration information that can be input and set using the input device includes an object-image distance and a lens path length.

With this information, a propagation delay of exposure light can be calculated for every model. This allows for the use of the same software system among apparatuses having different lens designs, thereby achieving versatility.

Sixth Exemplary Embodiment

A sixth embodiment is directed to an example where the same positional correction is applied not only to exposure light, but also to scan alignment performed using a lens optical system. An alignment optical system 123 (see FIG. 3) disposed on the reticle stage dynamically observes an alignment mark on the wafer or a reference mark on the wafer stage through a lens in the course of shifting of the reticle stage, so as to measure the amount of displacement. In the sixth embodiment, an amount of displacement corresponding to the amount of propagation delay of the light that is dependent on the stage shifting rate is added as a correction value to the measured value. In this case, the light exiting the reticle is reflected at the mark on the wafer so as to return to a microscope at the reticle side. The correction for the delay of the outgoing light is pursuant to the above embodiment, and the returning reflection light similarly undergoes a correction for the delay, which is reflected on the measured value.

Seventh Exemplary Embodiment

The first to sixth embodiments are directed to examples of an exposure apparatus equipped with a refractive projection system, i.e. lenses. A seventh embodiment relates to an EUV exposure apparatus that performs exposure using only a reflective optical system, i.e. mirrors, in vacuum.

In an EUV exposure apparatus, a propagation delay similarly occurs due to an optical distance between the object plane of the reticle mask and the image plane on the wafer. An advantage similar to the above can be achieved by performing similar corrections on the target control values of the stages that are in synchronization with each other. A displacement correction is important especially in a reflective optical system since a reflective optical system has an optical path that is longer than that of a refractive optical system.

Eighth Exemplary Embodiment

Referring to FIGS. 5 and 6, an embodiment of a device manufacturing method using the aforementioned exposure apparatus will be described below. FIG. 5 is a flow chart illustrating the method for manufacturing a device (e.g. a semiconductor chip such as an IC chip or an LSI chip, an LCD, and a CCD sensor). Here, a method for manufacturing a semiconductor chip will be described as an example.

Specifically, step S1 is a circuit design step for designing a circuit pattern of semiconductor chips. Step S2 is a mask fabrication step for fabricating a mask on the basis of the designed circuit pattern. Step S3 is a wafer fabrication step for fabricating a wafer using a material such as silicon. Step S4 is a wafer processing step, which is referred to as a front-end process. In this step, actual circuits are formed on the wafer by lithography using the prepared mask and wafer. Step S5 is an assembly step, which is referred to as a back-end process. In this step, semiconductor chips are formed from the wafer obtained in step S4. Specifically, this step S5 includes an assembly process (dicing and bonding) and a packaging process (chip sealing). Step S6 is an inspection step for testing the semiconductor chips obtained in step S5 for, for example, operation and durability. The semiconductor chips are thus completed through the above steps, and are subsequently shipped in step S7. The front-end process and the back-end process are performed at separate dedicated factories, and maintenance is implemented at each factory under a remote maintenance system. Information related to production management and device maintenance is exchanged between the factory performing the front-end process and the factory performing the back-end process via the Internet or a dedicated network.

FIG. 6 is a detailed flow chart of the aforementioned wafer processing step. Specifically, step S11 is an oxidation step where the surface of the wafer is oxidized. Step S12 is a CVD step for forming an insulating film on the surface of the wafer. Step S13 is an electrode formation step for forming electrodes on the wafer by vapor deposition. Step S14 is an ion implantation step for implanting ions into the wafer. Step S15 is a resist processing step for applying a photosensitive agent onto the wafer. Step S16 is an exposure step for printing the circuit pattern of the mask on the wafer by exposure using the above-described exposure apparatus. Step S17 is a development step where the exposed wafer is developed. Step S18 is an etching step for etching away parts other than the developed resist image. Step S19 is a resist removal step for removing the resist that has become unnecessary after the etching step. By repeating these steps, a multilayer circuit pattern is formed on the wafer. Since the manufacturing apparatuses used in the respective steps are maintained under the aforementioned remote maintenance system, problems can be prevented from occurring. Even if a problem does occur, a normal state can be quickly recovered, thereby achieving higher productivity of semiconductor devices than before.

According to the present invention, an amount of displacement caused by a shifting (scanning) rate occurring during each shot in a scanning exposure operation can be corrected, thereby enhancing the overlay accuracy of the patterns.

While the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions.

This application claims the benefit of Japanese Application No. 2007-070930 filed Mar. 19, 2007, which is hereby incorporated by reference herein in its entirety.

What is claimed is:

1. A scanning exposure apparatus that projects a pattern of an original onto a substrate via a projection optical system and shifts the original and the substrate in synchronization with each other with respect to an optical axis of the projection optical system so as to transfer the pattern of the original to the substrate by exposure, the scanning exposure apparatus comprising:

a unit configured to obtain a correction amount according to a rate at which the original and the substrate are shifted in synchronization with each other, for each rate of the original and the substrate, the correction amount for correcting a displacement between the original and the substrate that occurs due to the substrate being shifted at a predetermined rate during a propagation time of light between a pattern surface of the original and an exposed surface on the substrate, and to correct the displacement by controlling of the original or the substrate based on the obtained correction amount when the original and the substrate are shifted in synchronization with each other, wherein the correction amount is determined by multiplying the propagation time of the light by the shifting rate of the substrate.

2. The scanning exposure apparatus according to claim 1, wherein the correction amount is proportional to the propagation time of the light.

3. The scanning exposure apparatus according to claim 1, wherein the displacement is corrected with respect to a target position of the original or the substrate.

4. The scanning exposure apparatus according to claim 1, wherein the displacement is corrected with respect to a preliminarily determined first shift profile for a scanning exposure process, and a second shift profile for an actual exposure process is generated as a result of the correction.

5. The scanning exposure apparatus according to claim 1, wherein the displacement is corrected in real time in accordance with the shifting rate at each instant in the course of a scanning exposure process.

6. An exposure apparatus that projects a pattern of an original onto a substrate via a projection optical system and shifts the original and the substrate in synchronization with each other with respect to an optical axis of the projection optical system so as to transfer the pattern of the original to the substrate by exposure, the exposure apparatus comprising:

an alignment optical system configured to perform alignment measurement between the original and the substrate while the original and the substrate are shifted in synchronization with each other; and a unit configured to obtain a correction amount according to a shifting rate at which the original and the substrate are shifted in synchronization with each other, for each rate of the original and the substrate, the correction amount for correcting a measurement error that occurs due to the substrate being shifted at a predetermined rate during a propagation time of alignment measurement light between the original and the substrate, and to correct a value measured by the alignment measurement based on the obtained correction amount when the alignment measurement between the original and the substrate is being performed by the alignment optical system via the projection optical system, wherein the correction amount is determined by multiplying the propagation time of the light by the shifting rate of the substrate.

7. An exposure method for projecting a pattern of an original onto a substrate via a projection optical system and shifting the original and the substrate in synchronization with each other with respect to an optical axis of the projection optical system so as to transfer the pattern of the original to the substrate by exposure, the method comprising:

obtaining a correction amount according to a rate at which the original and the substrate are shifted in synchronization with each other, for each rate of the original and the substrate, the correction amount for correcting a displacement between the original and the substrate that occurs due to the substrate being shifted at a predetermined rate during a propagation time of light between a pattern surface of the original and an exposed surface on the substrate; and correcting the displacement by controlling shifting of the original or the substrate based on the obtained correction amount when the original and the substrate are shifted in synchronization with each other, wherein the correction amount is determined by multiplying the propagation time of the light by the shifting rate of the substrate.

8. An exposure method for projecting a pattern of an original onto a substrate via a projection optical system and shifting the original and the substrate in synchronization with each other with respect to an optical axis of the projection optical system so as to transfer the pattern of the original to the substrate by exposure, the method comprising:

performing an alignment measurement between the original and the substrate while the original and the substrate are shifted in synchronization with each other; and obtaining a correction amount according to a shifting rate at which the original and the substrate are shifted in synchronization with each other, for each rate of the original and the substrate, the correction amount for correcting a measurement error that occurs due to the substrate being shifted at a predetermined rate during a propagation time of alignment measurement light between the original and the substrate; and correcting a value measured by the alignment measurement based on the obtained correction amount when the alignment measurement between the original and the substrate is being performed by the alignment optical system via the projection optical system, wherein the correction amount is determined by multiplying the propagation time of the light by the shifting rate of the substrate.

9. A device manufacturing method utilizing a scanning exposure apparatus that projects a pattern of an original onto a substrate via a projection optical system and shifts the original and the substrate in synchronization with each other with respect to an optical axis of the projection optical system so as to transfer the pattern of the original to the substrate by exposure, the scanning exposure apparatus including a unit configured to obtain a correction amount according to a rate at which the original and the substrate are shifted in synchronization with each other, for each rate of the original and the substrate, the correction amount for correcting a displacement between the original and the substrate that occurs due to the substrate being shifted at a predetermined rate during a propagation time of light between a pattern surface of the original and an exposed surface on the substrate, and to correct the displacement by controlling shifting of the original or the substrate based on the obtained correction amount when the original and the substrate are shifted in synchronization with each other, the method comprising:

performing exposure on a substrate using the scanning exposure apparatus, wherein the correction amount is determined by multiplying the propagation time of the light by the shifting rate of the substrate.

10. A device manufacturing method utilizing an exposure apparatus that projects a pattern of an original onto a substrate via a projection optical system and shifts the original and the substrate in synchronization with each other with respect to an optical axis of the projection optical system so as to transfer the pattern of the original to the substrate by exposure, the exposure apparatus including an alignment optical system configured to perform alignment measurement between the original and the substrate while the original and the substrate are shifted in synchronization with each other; and a unit configured to obtain a correction amount according to a shifting rate at which the original and the substrate are shifted in synchronization with each other, for each rate of the original and the substrate, the correction amount for correcting a measurement error that occurs due to the substrate being shifted at a predetermined rate during a propagation time of alignment measurement light between the original and the substrate, and to correct a value measured by the alignment measurement based on the obtained correction amount when the alignment measurement between the original and the substrate is being performed by the alignment optical system via the projection optical system, the method comprising:

performing exposure on a substrate using the exposure apparatus, wherein the correction amount is determined by multiplying the propagation time of the light by the shifting rate of the substrate.

* * * * *